United States Patent [19]

Ham

[11] Patent Number: 5,576,124
[45] Date of Patent: Nov. 19, 1996

[54] PHASE SHIFT MASK AND METHOD FOR FABRICATING THE SAME

[75] Inventor: Young M. Ham, Bubaleub, Rep. of Korea

[73] Assignee: Hyundai Electronics Industries Co., Ltd., Rep. of Korea

[21] Appl. No.: 407,234

[22] Filed: Mar. 21, 1995

[30] Foreign Application Priority Data

Mar. 21, 1994 [KR] Rep. of Korea ............... 1994-5664

[51] Int. Cl.[6] ............................................. G03F 9/00
[52] U.S. Cl. ........................... 430/5; 430/311; 430/322; 430/324
[58] Field of Search ................... 430/5, 311, 322, 430/324

[56] References Cited

U.S. PATENT DOCUMENTS 5,208,125  5/1993  Lourey et al. ......................... 430/5
5,281,500  1/1994  Cathey et al. ......................... 430/5

*Primary Examiner*—S. Rosasco
*Attorney, Agent, or Firm*—Merchant, Gould, Smith, Edell, Welter & Schmidt

[57] ABSTRACT

A phase shift mask capable of achieving a variation in phase at the boundary between a light transmitting film and a phase shift film and thereby preventing formation of an undesirable pattern, and a method for fabricating the phase shift mask. The phase shifter has an inclined edge portion disposed at a boundary between the light transmitting film and the light shielding film. The method includes the steps of implanting impurity ions in the phase shifter and etching the phase shifter in a manner that the phase shifter is formed with an inclined edge portion at the boundary between the light transmitting film and the light shielding film.

1 Claim, 4 Drawing Sheets

ન,576,124

PHASE SHIFT MASK AND METHOD FOR FABRICATING THE SAME

BACKGROUND OF THE INVENTION

1. Field of the Invention

The present invention relates to a phase shift mask to be used in forming a pattern for use in a lithography process in the fabrication of a semiconductor device, and more particularly to a phase shift mask capable of preventing an undesirable pattern formation at an edge portion thereof where it is of the positive type and a method for fabricating such a phase shift mask.

2. Description of the Prior Art

As semiconductor devices have a higher degree of integration, a more sophisticated photo lithography technique is needed. In this connection, there has been much research into making a phase shift mask with a phase shift material formed on a transparent mask substrate. However, such a phase shift mask involves various problems solved because it has difficulties in design, fabrication and defect control.

FIG. 1 is a plan view illustrating a conventional positive type phase shift mask. FIG. 2 is a diagram explaining the concept of a phase shift at a pattern edge. On the other hand, FIG. 3 is a plan view illustrating a pattern formed using the mask shown in FIG. 1. The conventional phase shift mask and problems encountered in using the conventional phase shift mask will be described in conjunction with FIGS. I to 3.

The mask shown in FIG. 1 is called a "Levenson type mask" which is a phase shift mask exhibiting a superior processing effect. Furthermore, this mask can be fabricated using a positive photoresist film because it is designed as being of the positive type. However, this mask involves generation of a reverse phase shift of light at a region 5 where the edge of a phase shift material is in contact with a substrate, as shown in FIG. 3. This results in formation of an undesirable pattern 4, as shown in FIG. 3.

On the other hand, in case of a negative type mask, the above-mentioned problem encountered in the positive type mask is not generated. However, the entire process needs to be varied to be compatible with a negative photoresist film because all of the existing processes are designed to be compatible only with the positive photoresist film.

SUMMARY OF THE INVENTION

Therefore, an object of the invention is to solve the above-mentioned problems encountered in the prior art and, thus, to provide a phase shift mask capable of achieving a variation in phase at the boundary between a light transmitting film and a phase shifter and thereby prevent formation of an undesirable pattern, and a method for fabricating the phase shift mask.

In accordance with one aspect, the present invention provides a phase shift mask including a light transmitting film, a light shielding film patterned on the light transmitting film, and a phase shifter formed on both the light transmitting film and the light shielding film, wherein the phase shifter has an inclined edge portion disposed at a boundary between the light transmitting film and the light shielding film.

In accordance with another aspect, the present invention provides a method for fabricating a phase shift mask, comprising the steps of: forming a light shielding film on a light transmitting film, patterning the light shielding film to have a predetermined pattern, and then coating a phase shifter over the entire exposed surface of the resulting structure obtained after the patterning step; coating a photoresist film on the phase shifter and then etching the phase shifter by use of the photoresist film as a mask in a manner that the phase shifter is formed with an inclined edge portion at a boundary between the light transmitting film and the light shielding film; and removing the photoresist film after the etching step.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

The present invention will now be described in detail, in conjunction with FIG. 4, FIGS. 5A to 5C and FIGS. 6A and 6B.

Figure 1:
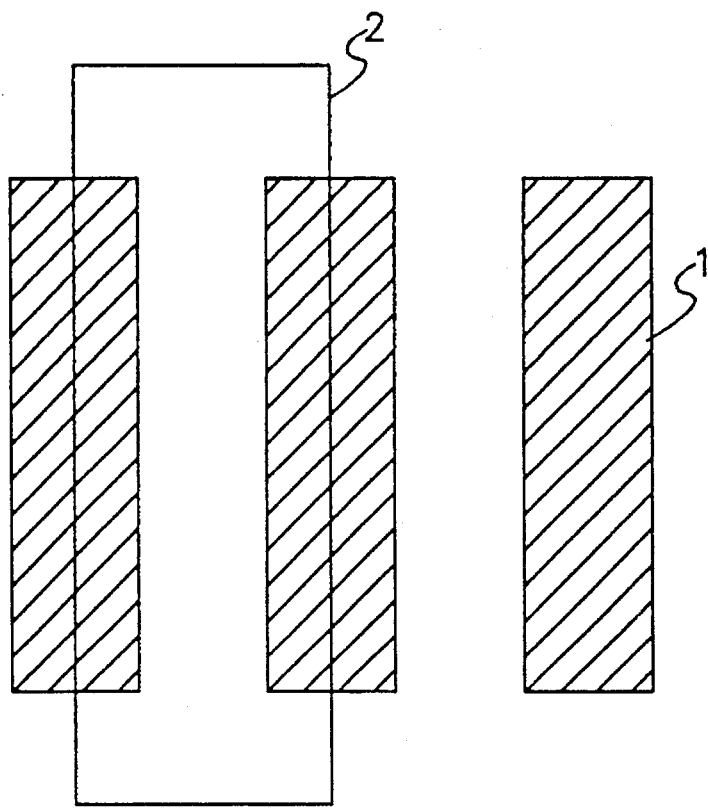
FIG. 1 is a plan view illustrating a conventional positive type phase shift mask.
Figure 2:
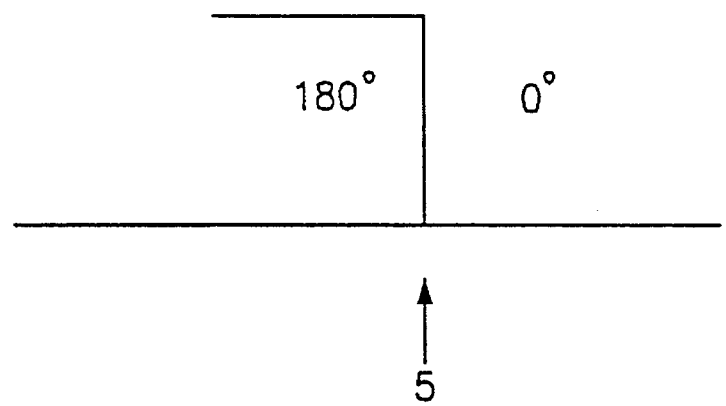
FIG. 2 is a diagram explaining the concept of a phase shift at a pattern edge.
Figure 3:
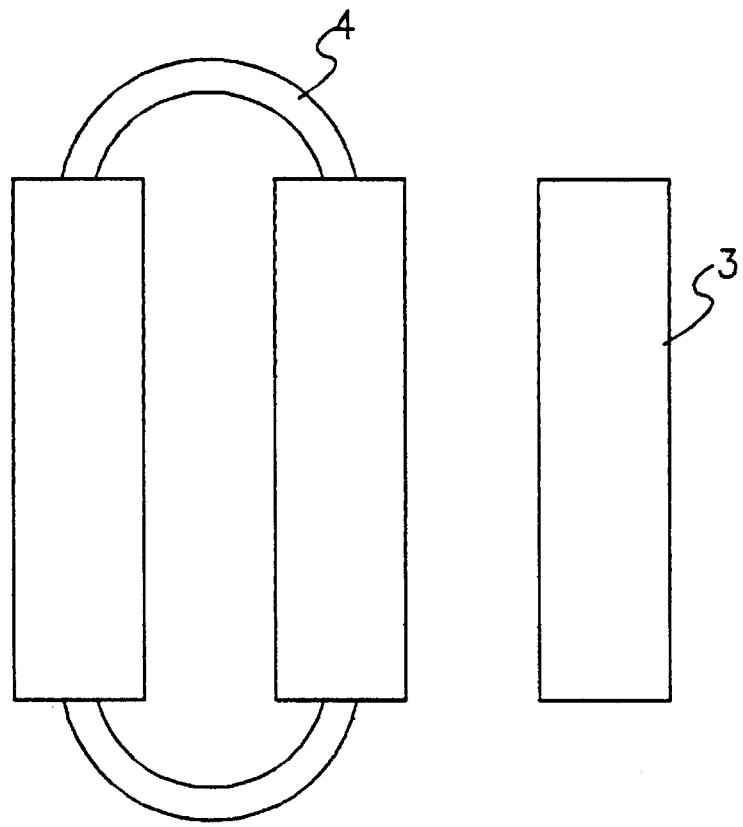
FIG. 3 is a plan view illustrating a pattern formed using the mask shown in FIG. 1.
Figure 4:
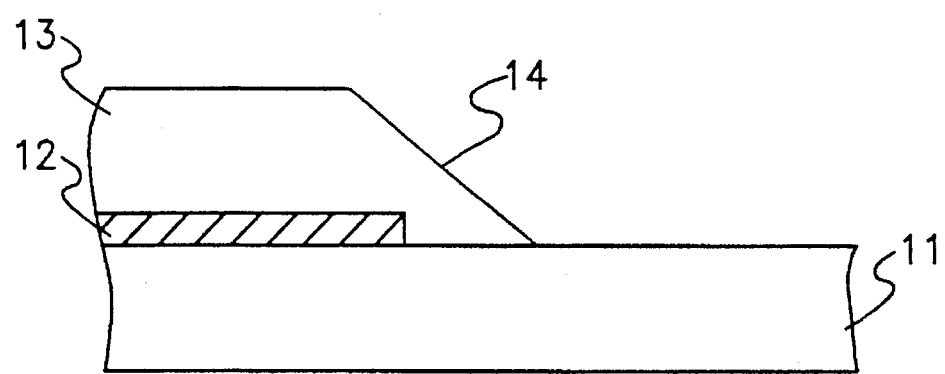
FIG. 4 is a sectional view illustrating a phase shift mask with an inclined edge in accordance with the present invention.

The present invention relates to a technique for preventing a pattern error caused by a reverse phase shift by forming an inclined edge portion of a phase shift film 13 which is in contact with a light shielding film consisting of, for example, a chromium film 12 formed on a light transmitting film consisting of, for example, a quartz substrate 11 in FIG. 4, and thereby varying the phase of light at the inclined edge portion in a range of 0° to 180°.

Figure 5A:
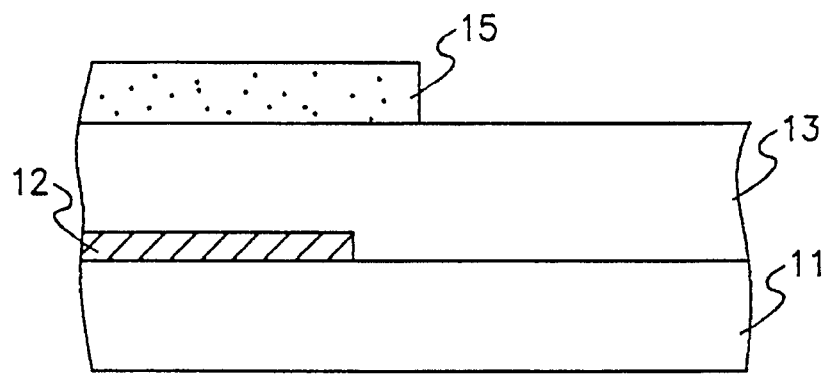
FIGS. 5A to 5C are sectional views respectively illustrating a method for fabricating a phase shift mask in accordance with an embodiment of the present invention.
Figure 5B:
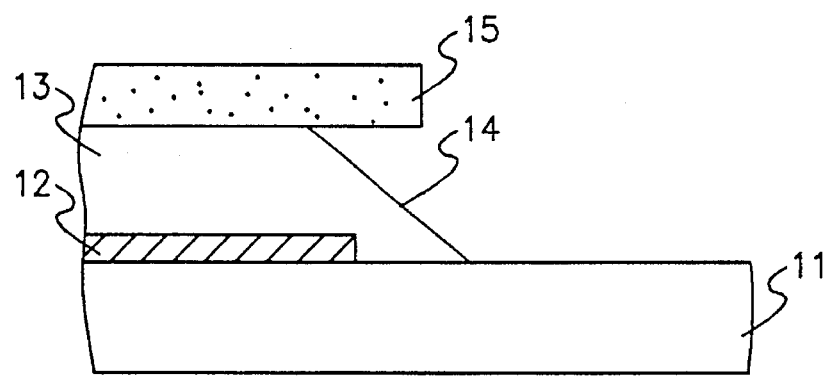
Figure 5C:
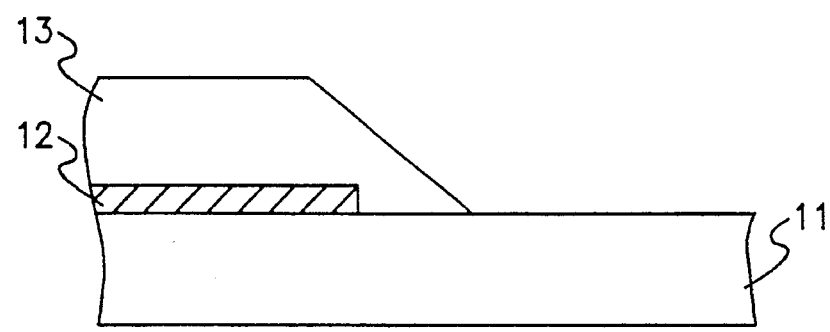

FIGS. 5A to 5C are sectional views respectively illustrating a method for fabricating a phase shift mask in accordance with an embodiment of the present invention. In FIGS. 5A to 5C, the reference numeral 11 denotes a quartz substrate, 12 a chromium film, 13 a phase shifter, 14 a boundary between the chromium film 12 and the phase shifter 13, and 15 a photoresist film.

In accordance with this method, first, a light shield material such as chromium is formed over the quartz substrate 11 made of a light transmitting material to form the chromium film 12, as shown in FIG. 5A. The chromium film 12 is then patterned to form a predetermined pattern. Over the entire exposed surface of the resulting structure, a phase shift material is coated to form the phase shifter 13. Subsequently, a photoresist material is coated over the phase shifter 13, thereby forming the photoresist film 15. The photoresist film 15 is then patterned such that it extends laterally beyond the chromium film 12.

Thereafter, the phase shifter 13 is wet etched using the pattern of photoresist film 15 as a mask so that it has an inclined edge, as shown in FIG. 5B.

Finally, the photoresist film pattern is removed. The resulting structure is shown in FIG. 5C.

Figure 6A:
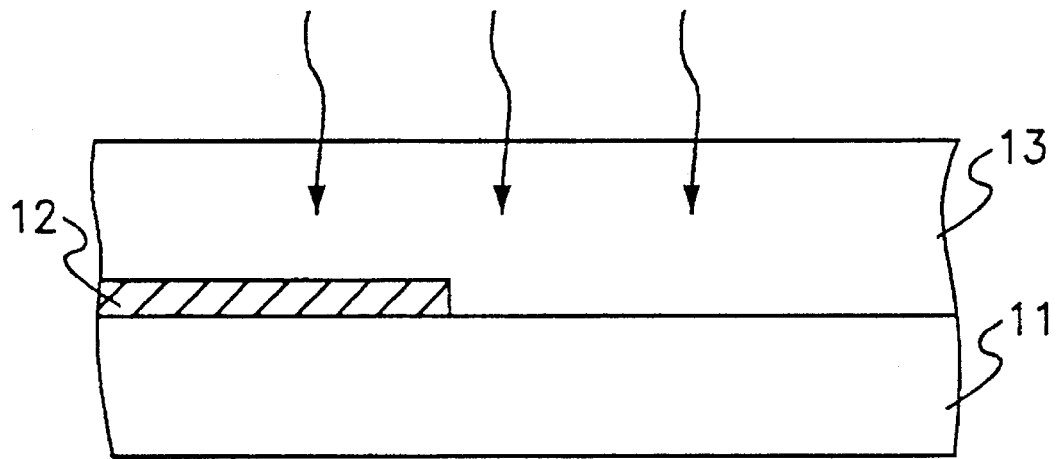
FIGS. 6A and 6B are sectional views respectively illustrating a method for fabricating a phase shift mask in accordance with another embodiment of the present invention.
Figure 6B:
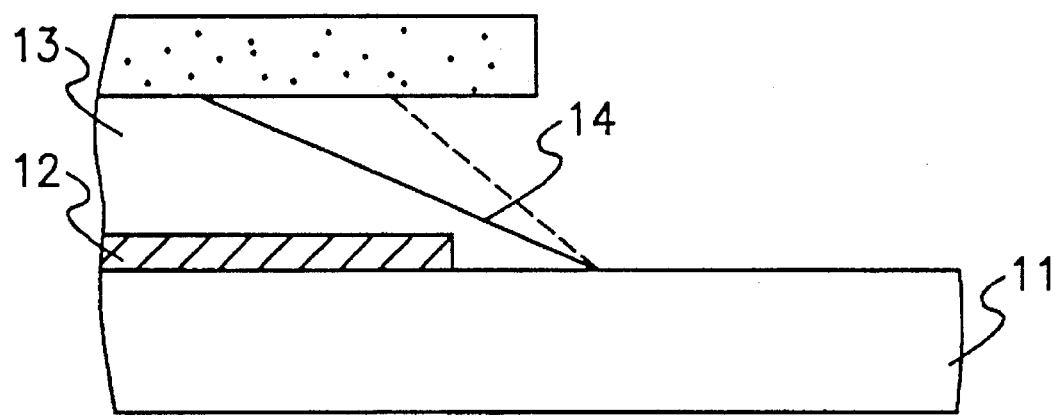

FIGS. 6A and 6B are sectional views respectively illustrating a method for fabricating a phase shift mask in accordance with another embodiment of the present invention. In FIGS. 6A and 6B, the reference numeral 11 denotes a quartz substrate, 12 a chromium film, 13 a phase shifter, 14 a boundary between the chromium film 12 and the phase shifter 13, and 15 a photoresist film.

In accordance with this method, first, a light shielding material such as chromium is formed over the quartz substrate 11 made of a light transmitting material to form the chromium film 12, as shown in FIG. 6A. The chromium film 12 is then patterned to form a predetermined pattern. Over the entire exposed surface of the resulting structure, a phase shift material is coated to form the phase shifter 13. Thereafter, phosphorous ions are implanted in the phase shifter 13.

Subsequently, a photoresist material is coated over the phase shifter 13, thereby forming the photoresist film 15, as shown in FIG. 6B. The photoresist film 15 is then etched so that it has an inclined edge. Since the bonding force generated between the phase shifter 13 and the photoresist film 15 is decreased due to the implanted phosphorous ions, an etchant solution used for the etching of photoresist film 15 can penetrate side walls of the photoresist film 15 more deeply upon the etching. As a result, a gently inclined etch pattern can be obtained.

As apparent from the above description, a desired pattern can be obtained without any pattern error in accordance with the present invention because no undesirable pattern is formed at the edge portion of the phase shifter. This enables use of positive type processes and fabrication of positive masks. Accordingly, it is possible to design isolation patterns, bit and word lines and capacitors, all otherwise having difficulties in design.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a phase shift mask, comprising the steps of:

forming a light shielding film on a light transmitting film, patterning the light shielding film to have a pattern, and then coating thereon a phase shifter;

coating a photoresist film on the phase shifter;

implanting impurity ions in the phase shifter after the step of coating the phase shifter;

then etching the phase shifter by use of the photoresist film as a mask in a manner that the phase shifter is formed with an inclined edge portion at a boundary between the light transmitting film and the light shielding film; and removing the photoresist film after the etching step.

\* \* \* \* \*